United States Patent [19]

Lehrer

[11] Patent Number: 4,935,095
[45] Date of Patent: Jun. 19, 1990

[54] GERMANOSILICATE SPIN-ON GLASSES

[75] Inventor: William I. Lehrer, Los Altos, Calif.

[73] Assignee: National Semiconductor Corporation, Santa Clara, Calif.

[21] Appl. No.: 747,470

[22] Filed: Jun. 21, 1985

[51] Int. Cl.[5] .................. H01L 21/306; B44C 1/22; C03C 17/00; C03C 25/02

[52] U.S. Cl. .................. 156/644; 65/60.53; 156/653; 156/656; 156/657; 156/659.1; 156/662; 357/71; 357/73; 437/228; 437/235; 501/55

[58] Field of Search ............. 29/571, 580, 578, 579, 29/591, 576 W; 427/88-91, 93, 95; 65/60.53; 156/644, 653, 656, 657, 659.1, 661.1, 662; 357/41, 49, 59, 71, 73; 501/55, 63; 437/228, 235

[56] References Cited

U.S. PATENT DOCUMENTS

| | | | |
|---|---|---|---|
| 3,475,210 | 10/1969 | Lehrer | 117/215 |
| 4,417,914 | 11/1983 | Lehrer | 65/60.53 |
| 4,490,737 | 12/1984 | Pierce et al. | 357/73 |
| 4,539,744 | 9/1985 | Burton | 29/576 W |

FOREIGN PATENT DOCUMENTS 0060784  9/1982  European Pat. Off. .
3215149 10/1983  Fed. Rep. of Germany .
2062962  5/1981  United Kingdom .

OTHER PUBLICATIONS

VLSI Technology, edited by S. M. Sze, ISBN 0-0-7-062686-3 (1983), pp. 107, 109, 111–115.
Extended Abstracts, vol. 84, No. 2, 1984, pp. 488–489, Abstract No. 350, New Orleans, La., U.S.; S. K. Gupta: "Spin-on Glass Materials for Smooth Interlevel Dielectric Layers".
U.S. Application Ser. No. 765,892, filed 8/14/85.

Primary Examiner—William A. Powell
Attorney, Agent, or Firm—Lee Patch; Robert C. Colwell; Vernon A. Norviel

[57] ABSTRACT

A process is disclosed for forming a planarized or smooth surface binary glass insulating film comprised of germanium dioxide and silicon dioxide by a spin-on process. The resulting structure has a film thickness uniformity which varies less than 5% over the surface of the wafer. The structure is formed by mixing a predetermined solution of TEOS and TEOG in a lower alcohol or ketone solvent and catalyzing by the addition of sufficient acid to raise the pH to 1.5 to 2.0 to favor gel formation. The resultant solution is then spun on at an RPM selected to give the desired film thickness for a given solids content of the solution.

31 Claims, 3 Drawing Sheets

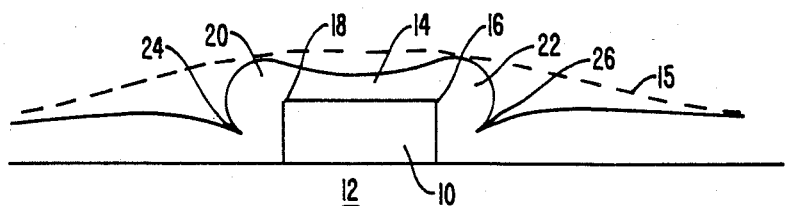
FIG._1.
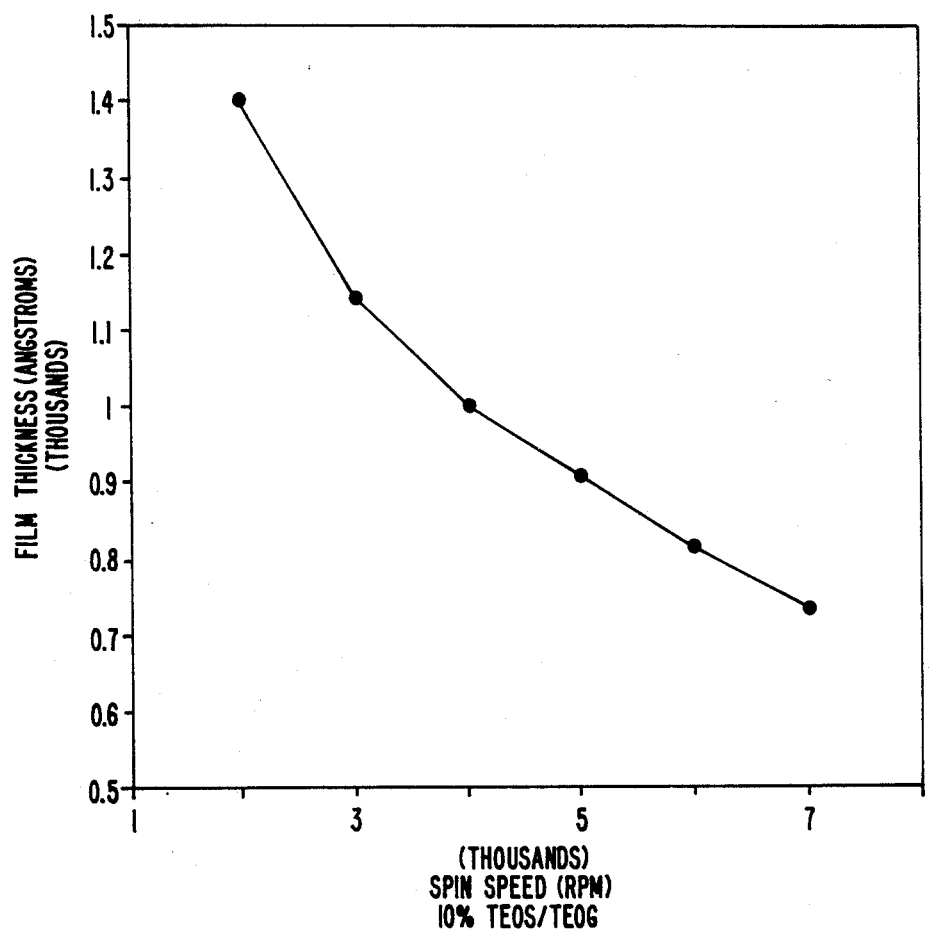
FIG._2.

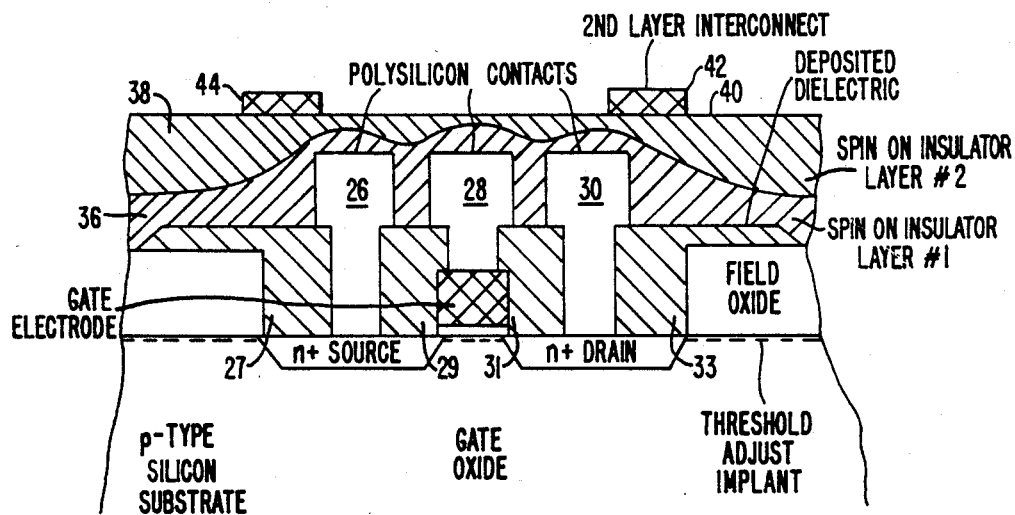
FIG._3.
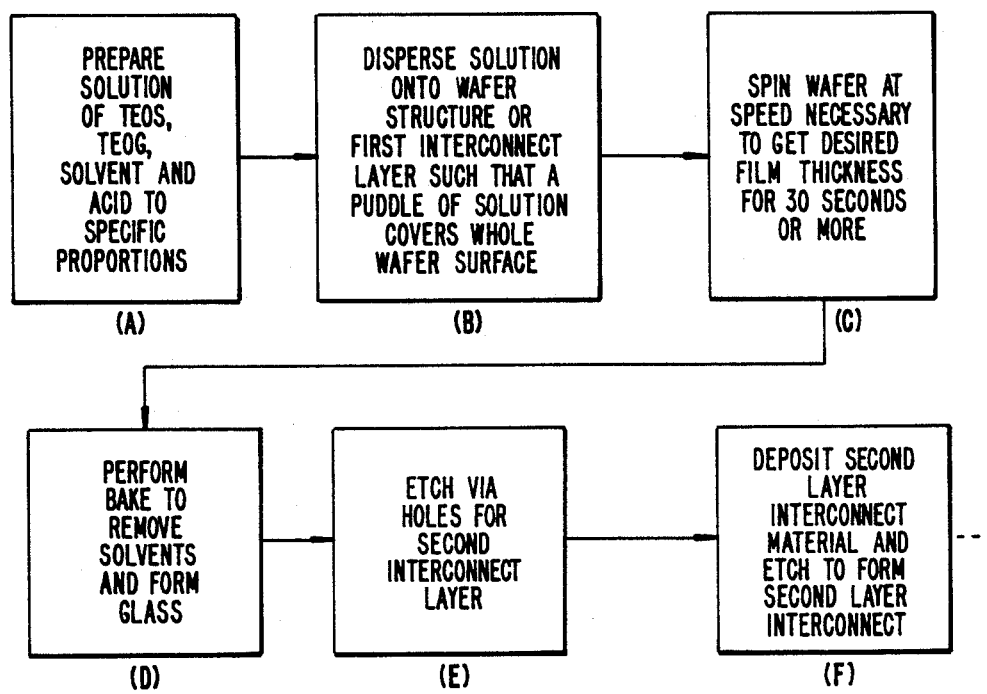
FIG._4.

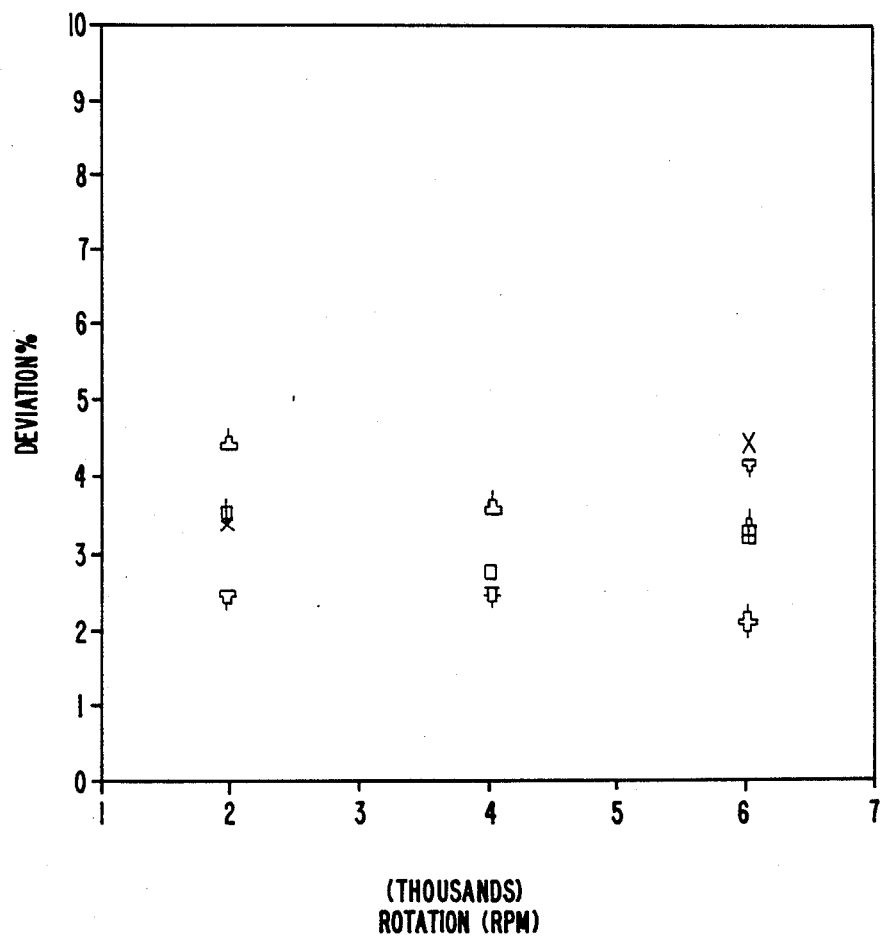
FIG._5.

GERMANOSILICATE SPIN-ON GLASSES

BACKGROUND OF THE INVENTION

This invention relates to the field of semiconductor processes that are compatible with scaling down of devices to smaller sizes and increasing the complexity of the metal and polysilicon interconnect patterns coupling various devices on the die to each other. More particularly, the invention relates to a process for creating a planarized layer of germanosilicate glass between polysilicon and some types of metal interconnect layers.

One of the major problems in semiconductor device fabrication is to make devices ever more complex without increasing the size of the die. Increased die size decreases yield and increases cost. However, to increase complexity on an integrated circuit die requires that thousands of transistors be interconnected into very complex circuit patterns. The interconnection patterns that result are very complicated and involve many crossing conductors. However in integrated circuit fabrication conductors are usually formed in polysilicon or metals like aluminum, titanium or tungsten by photolithography processes. This involves projecting light patterns on a two dimensional plane to form a two dimensional pattern in the conductor after performing certain etching steps that are well known. This is fine as long as one desires that at every place that two conductors cross each other that there be a circuit connection. However, where two conductors which cross each other are not supposed to be in electrical contact with each other, there is a problem in making a crossover or crossunder such that the two conductors do not make electrical contact with each other. These problems grow in number as device complexity increases. One way of alleviating this problem is to add a second layer of conductor over the first conductor layer and separating the two by an insulating layer. This process of adding conductive layers can be repeated as many times as necessary.

However these intermediate layers of insulating material must be flat and of high integrity to be effective. The insulating layer must be of high integrity. i.e., no pinholes or cracks, so as to prevent shorts between layers or open circuits in the layers above it caused by failure of the layers deposited above to fill in the cracks in the insulator. The insulator must be flat to have good photolithography characteristics. Major problems are created in forming subsequent layers using photolithography when trying to project very fine and closely spaced patterns of light onto a non-flat surface. Such problems include depth of field difficulties and other well known problems.

Further, the insulating layer which is used should be relatively free of dopants such as phosphorus which could come out of the insulating layer and enter portions of the structure surrounding the insulating layer during later high temperature processing steps.

Further, these intermediate insulating layers must have a coefficient of thermal expansion which substantially matches that of the underlying layers. This prevents cracking of the insulating layer caused by uneven thermal expansions in different layers in the structure during later high temperature processing steps or thermal cycling during service of the device in the field.

Many integrated devices today use doped polysilicon for a first conductive layer. In the prior art phosphorous doped silicon dioxide or plain silicon dioxide or germanosilicate glasses have been deposited over this polysilicon by chemical vapor deposition or low pressure chemical vapor deposition. This is an expensive and time consuming process, not usually done in a more efficient cassette to cassette operation. Further many of the gases used in the chemical vapor deposition processes can be toxic, flammable or corrosive or all three.

Further, many chemical vapor deposition processes exhibit enhanced deposition at sharp corners under most reaction conditions. For example, FIG. 1 shows an etched polysilicon step 10 on a substrate 12. A film 14 of silicon dioxide has been deposited by chemical vapor deposition. The line 15 shown in phantom represents the surface of a layer of spun-on glass, and illustrates the differences in planarization which result from the two different processes of depositing insulating material. For chemical vapor deposition processes, the sharp points 16 and 18 of the polysilicon step 10 cause increased chemical activity in these regions, which results in the bulges 20 and 22 being formed in the film 14 near the cornets 16 and 18. Immediately below these bulges, microcracks 24 and 26 can form. These cracks are extremely difficult to cover completely with metal, and can lead to open circuits. This bulge formation process is intrinsic to the chemical vapor deposition process under most conditions. Further, this creates a non-flat surface upon which to do subsequent photolithography. Non-flat surfaces make the projection of light to define images in photoresist of closely spaced conductors or other features on subsequent layers difficult or impossible. Further, non-flat surfaces such as that presented by the top surface of the oxide layer 14 with microcracks make it extremely difficult to deposit uniform films of metal with high integrity i.e., no cracks or crevices in the metal film which can lead to open circuits in conductors which are supposed to be continuous.

In contrast, notice the relatively smooth geometry of the top surface 14 of the spun-on glass. This gently rolling surface makes it simple to deposit high integrity metal films from which interconnection wires can be formed with no fear of open circuits. Likewise, if another layer of spun-on glass is added, the resulting surface is flat or almost flat, and photolithography to form very fine features which are closely spaced becomes possible.

Chemical vapor deposition processes are also high temperature processes generally with typical reaction temperatures for formation of silicon dioxide films ranging from 400 to 900 degrees centigrade depending upon the gases and chemical reactions used to form the film. These higher temperatures preclude use of these processes over some structures which are temperature sensitive. Further, these high deposition temperatures can cause lateral and other undesired diffusion of dopants previously in other locations on the integrated circuit. This can cause undesirable effects such as changes in base width or channel length in transistors previously formed.

Finally uniformity of film coverage and flatness in regions away from corners of steps and trenches is generally not consistent in chemical vapor deposition processes.

It is known that the CVD process can be avoided by using a spin method to spin on coatings of silicon dioxide. In these methods, a modified alcoholic solution of tetraethoxygermane (hereafter TEOS) can be spun onto a silicon wafer, heated appropriately and a glassy silicon dioxide film will be formed. This eliminates some of the disadvantages of CVD and LPCVD processes, but leaves a major disadvantage. The major problem with this technique is that above a thickness range of approximately 3000 angstroms, the film develops cracks. These cracks are totally unacceptable since they decrease yield and render the devices unreliable.

Stress in films deposited on wafers is a function of the degree of mismatch in the coefficient of thermal expansion and the thickness of the film. Higher degrees of mismatch cause more stress as do thicker films. Various modifiers can be added to the solution, but useful thicknesses of 7,000–10,000 angstroms have not been achieved to data.

Therefore a need has arisen for a method of depositing a dopant free insulator film that was flat, had high integrity, was cheap and fast, and which could be deposited at a lower temperature and which resulted in a film which had a good match in thermal coefficient with the underlying structure.

SUMMARY OF THE INVENTION

This invention is a process for depositing an insulating film over a polysilicon or some types of metal conductive layers by a low temperature spin-on technique using a solution of TEOS and TEOG in a solvent system which is pH controlled by the addition of an acid. A 10% solution of TEOS and TEOG can be dissolved in any of the lower alcohols and ketones as well as some combinations of the two. Solution pH is adjusted by the addition of an acid to bring the pH to approximately 1.5 to 2.0 to favor formation of a germanosilicate gel polymer. The gel is formed in the solvent solution at the correct pH and becomes apparent during the spinning of the solution upon the wafer as a gel coating that can then be heat treated to form the desired oxide or mixed oxide film.

The solution is then spun onto a wafer upon which the desired structures have already been formed. After a minimum of 30 seconds of spinning, the solution is evenly spread out over the wafer which tends to smooth and flatten the wafer topography. The first coat tends to smooth out sharp edges, while subsequent coats tend to create flatter surfaces. The degree of flatness can be controlled by using more coats.

Thereafter, a one or two stage baking step is performed to drive out the solvents and to form the oxides from the gel.

In the preferred embodiment, a first stage bake is performed at approximately 135 degrees centigrade for 5–10 minutes to drive out most of the solvents. Thereafter, a second stage bake at a temperature in the range from 400 to 1000 degrees centigrade is performed to form and densify the oxide film.

The resultant film is a very flat, phosphorus free binary glass comprised of 45–50 mole percent germanium dioxide with the balance being silicon dioxide. The film is of a uniform thickness with very few pinholes, and it has a thermal expansion coefficient which very closely matches that of polysilicon. The presence of TEOG in the solution creates the binary germanosilicate glass. The presence of germanium dioxide in the silica matrix raises the thermal expansion coefficient to a useful match to that of the underlying polysilicon or epitaxial silicon when the glass composition is nominally 50–50 mole percent germanium dioxide-silicon dioxide. The result is that very thick films on the order of two microns can be fabricated over polysilicon and epitaxial silicon without formation of cracks. These thick films are very important to forming planarized insulation layers upon which to project images for further fabrication. This planarization is very critical to scaling present sized technologies down to the sub-one micron range for VLSI device fabrication.

BRIEF DESCRIPTION OF THE DRAWINGS

FIG. 1 is a cross section of a polysilicon step on a substrate covered with a CVD oxide layer and a spun-on coating to illustrate the differences in flatness achieved by these two techniques.

FIG. 2 is a characteristic curve defining the relationship between spin speed and film thickness.

FIG. 3 is cross-sectional view of the structure of a typical structure formed using the invention consisting of a first layer interconnect of polysilicon material insulated from a second layer of interconnect material made of metal by an intervening two layers of spun-on binary germanosilicate glass.

FIG. 4 is a process flow diagram for the process of the invention.

FIG. 5 is an experimentally determined plot of the deviations of layer thickness for the spun-on layers of binary glass deposited using the invention versus spin speed of the application of the starting solution.

DETAILED DESCRIPTION OF THE PREFERRED EMBODIMENT

In the preferred embodiment, a solution of TEOS, TEOG, a solvent such as a lower alcohol or a ketone, and a compatible mineral or organic acid such as nitric acid or hydrochloric acid is prepared. The solution composition is as follows:

*2.53–2.76 grams of tetraethoxygermane (TEOG);
*2.47–2.24 grams of tetraethoxysilane (TEOS) Si-$(OC_2H_5)_4$;
*45 grams of solvent such as a lower alcohol or ketone;
*0.03 grams compatible mineral or organic acid such as $HNO_3$.

If 2.53 grams of TEOG and 2.47 grams of TEOS are used, the resultant binary glass is 45 mole percent germanium dioxide and 55 mole percent silicon dioxide. If 2.76 grams of TEOG and 2.24 grams of TEOS are used, the resultant binary glass will be 50–50 mole percent germanium dioxide-silicon dioxide. Other solutions of course yield differing binary glass compositions. The preferred composition is 2.76 grams TEOG and 2.23 grams TEOS with all other components being the same.

The solvent used is not critical to the invention, and any solvent that will dissolve TEOS and TEOG and be compatible with the spinning and firing process will be adequate. Examples of types of alcohols that will work are: ethyl, methyl, butyl, or propyl. Examples of ketones that will work are MEK and acetone. That factors which matter are the target mole percentage composition of the resultant binary glass and the film thickness thereof. The mole percent of the composition of the binary glass that results depends upon the relative amounts of TEOS and TEOG that were present in the original solution. Since any of these compounds that do not go into solution will not be in the final composition, the solvent selected should be such the solubility of TEOS and TEOG in it is such that the selected amount of each compound dissolves completely. If the solubility is otherwise then the resultant binary glass will not have the mole percent composition intended for it.

Further, the film thickness depends upon the viscosity of the solution and the spin speed. The spin speed versus film thickness for a given viscosity of the above solution is given by FIG. 2. Note that the curve assumes a 10% TEOS and TEOG solution. Thus, the solvent must be such that the resultant solution is 10%, which is only true if the selected amounts of TEOS and TEOG from the above ranges are totally dissolved in the solvent such that 10% by weight of the solution is TEOS and TEOG.

Generally any of the lower alcohols and lower ketones and some combinations of the two will meet the above requirements. It is possible that other polar solvents will also meet these requirements such as to be functional equivalents. The preferred solvent is absolute ethyl alcohol, but other solvents are cheaper.

The particular acid used is not critical to the invention as long as it is compatible with the other components of the solution. Generally any mineral acid with the exception of hydrofluoric acid can be used. Obviously adding an acid such as phosphoric or boric acid would add these dopants, P or B, to the glass, which may or may not be desirable depending upon the application. A sufficient amount of acid must be added to bring the pH of the solution to between 1.5 and 2.0.

This solution is spun onto a wafer conductor structure or other structure which is to be insulated from the elements or from other layers which are to be formed above it. The thickness of the layer to be formed in this spin-on process is a matter of choice for the designer depending upon the application involved. The layer thickness can be controlled for any given solution solids content and viscosity by controlling the spin speed at which the layer is deposited. FIG. 2 illustrates the relationship between the spin speed and the resultant layer thickness for a 10% solution.

FIG. 3 illustrates a typical circuit structure over which the insulating film might be applied. FIG. 3 illustrates an MOS transistor with polysilicon source drain and gate contacts 26, 28 and 30 respectively. The typical situation wherein the invention would be used would be to add another layer of interconnects above the polysilicon contact layer of which contacts 26, 28 and 30 are a part. To do this, a layer of insulator material must be formed over the first layer interconnect polysilicon. This is accomplished using the invention as follows.

The second layer of interconnect structure will have to be formed photolithographically by the etching of the interconnect pattern in a layer of metal or polysilicon deposited on an insulating layer formed over the first layer of polysilicon interconnects. To do this photolithographic process properly, a flat or gently rolling surface on top of the insulating layer over the first layer polysilicon must be formed. To do this either a very thick layer of insulator must be formed or several layers of insulator must be formed to smooth out the sharp step junctions such as at the upper corners of the polysilicon contacts 26, 28 and 30. As noted with respect to the discussion of FIG. 1, if CVD oxide is deposited, the bulges 22 and 20 will result under many reaction conditions at the corners of each of the polysilicon contacts 26, 28 and 30. Worse yet, deep crevices such as the crevices 24 and 26 in FIG. 1 can form at the intersections of the polysilicon contacts 26, 28 and 30 with the CVD insulating oxide layers 27. 29, 31 and 33. These crevices would be very hard to fill when an overlying metal layer was deposited on top of a CVD oxide layer. Indeed, these crevices would likely result in a discontinuity in the metal coverage of the second layer of metal. Thus CVD oxide is not a very good choice for an intervening insulating layer between two layers of interconnects.

The invention solves this crevice and bump problem by eliminating the need for a CVD deposition. This is done by use of a spin-on process to deposit a solution which is turned first into a gel polymer and later into a binary glass. The final structure of a transistor using polysilicon contacts 26, 28 and 30 in a first layer of interconnect structure and a second interconnect layer of metal conductors 42 and 44 is shown in FIG. 3. In FIG. 3, the two layers of interconnect structure are separated by a planarized layer of spun-on binary glass comprised of two separately spun-on layers 36 and 38 of binary germanosilicate glass. The steps of this spin-on process will be described with reference to FIGS. 4.

Referring to FIG. 4(A) the first step is to prepare the solution defined above. Then the wafer having the transistor structure of FIG. 3, or whatever other structure that is to be covered, is placed in a spinning device such as is conventionally used to spin on photoresist. Known processes are used to form the transistor structure of FIG. 3 as it exists prior to the step of spinning on the binary germanosilicate glass forming solution described above. Spinning devices are well known in the industry as they have been used for years to deposit photoresist films. The spinning process for photoresist is also well known, and is described in detail by David Elliot in *Integrated Circuit Fabrication Technology* (1982)(McGraw Hill Book Company). Library of Congress NumberTK7874.E49. ISBN 0-07-019238-3, at Chapter 6. This book is hereby incorporated by reference.

A quantity of this solution is then placed on the wafer center and allowed to flow out to the edges of the wafer as indicated by FIG. 4(B). The wafer is then spun at the speed necessary to obtain the desired film thickness as indicated in FIG. 4(C). As indicated at page 128 of Elliot, the film thickness is a proportional to the square of the solids content of the solution and inversely proportional to the square root of the spin RPM. However, that formula is for photoresist, and the binary glass forming solution used in the invention is slightly different, although the relationship is still generally true. The actual relationship between the spin speed and the resulting film thickness is given by the curve of FIG. 2. In the preferred embodiment, the desired film thickness is between 1400 and 1000 angstroms, which, by reference to FIG. 2, translates into a spin speed of between 2000 and 4000 RPM. Since very precise control of the spin speed can be maintained, the film thickness can be controlled equally precisely. Note that the curve of FIG. 2 assumes a 10% TEOS & TEOG solution.

There are several options available here for film thickness. If the underlying interconnect layer is polysilicon, then the expansion coefficient of thermal expansion of the binary glass which will result will be very closely matched to that of the polysilicon. This allows a very thick film or several thin films of the binary glass to be spun on since the stress in the film will be low, and there is little or no chance of cracking.

Stress in the film is related to the film thickness, the relative match of the thermal expansion coefficients and the deposition temperature among other things. A more detailed discussion of film stress will be found in S.M. Sze. ed., *VLSI Technology* (1983) (McGraw Hill Book Company). Library of Congress Number TK7874.V566, lSBN 0-07-062686-3, which is incorporated herein by reference.

However, if the underlying first layer interconnect material is metal, the thermal expansion coefficient match is not going to be very good with the binary glass for some metals such as aluminum. In such a case, a very thin film must be applied to avoid cracking. Some metals such as tungsten have thermal expansion coefficients which are a closer match with a germanosilicate binary glass however, and on these metals a thicker film can be deposited with less chance of cracking. The invention finds its primary utility is spin-on deposition of binary glasses over polysilicon conductive layers. In this situation, the film thickness can be very large compared to those films which were available in the prior art and no cracking occurs.

Alternatively however, several layers of spun-on binary glass can be used over the underlying polysilicon. This is the situation depicted in FIG. 3 where a first spun-on layer 36 of binary glass is used to soften the sharp edges of the underlying polysilicon steps. A second spun-on layer 38 of binary glass is then used over the first layer to planarize the insulating layer comprised of layers 36 and 38 to form a flat surface 40. This flat surface makes an ideal "screen" upon which to perform photolithographic operations to form the second layer interconnect structure. Metal conductors 42 and 44 form part of this second interconnect layer, but these conductors could also be polysilicon if a third or fourth layer of interconnect was to be used.

The spin-on process gives great flatness of the deposited films as illustrated by FIG. 1 surface 15 compared with the upper surface of the CVD oxide layer. This flatness derives from the centrifugal force tending to pull off excess solution and evenly distribute the solution aver the wafer surface. Any ripples which try to form in the surface have forces of surface tension, centrifugal force and adhesion to the surface which tend to smooth them out, thereby creating a smooth surface.

The final step in the process of forming the binary glass insulation layer between the two interconnect layers is to bake the solution to drive off the solvents and to form the oxides in the binary glass. In the preferred embodiment, the bake step illustrated in FIG. 4(D) is performed in two stages. The first stage is a low temperature bake at approximately 135 degrees centigrade for 5-10 minutes to drive off the solvents. The purpose of this bake is to form the gel-like polymer which remains after the solvents are gone from the solution. The chemical reactions that take place are unclear, but it is known that some formation of polymers takes place. The second stage bake is preferably done at between 450 and 500 degrees centigrade for 15-30 minutes. The purpose of this bake is convert the polymer gel into germanium dioxide and silicon dioxide. Higher or lower temperatures can be used, but this will change the time for the reactions to take place. Higher temperatures yield a denser binary glass, i.e., the compaction of the glass improves which gives it greater structural integrity and higher resistance to the diffusion of unwanted impurities into the structures below. Greater density also changes the etch rate of the binary glass. Fundamentally, any temperature which will not damage the structure below the binary glass layer can be used. Higher temperatures are generally better unless there are implanted regions or other impurity doped regions which might change dimension in an unwanted way during a high temperature densification step for the binary glass.

Higher temperatures are not needed for flattening the binary glass structure by reflow, however, since all flatness in the structure is derived through the spin-on process alone. This is the reason no phosphorous dopant is used in the binary glass. Phosphorous dopant was used in the CVD deposited P-glasses of the prior art to lower their melting temperatures sufficiently such that they could be melted for reflow to smooth the surface for easier photolithography and better metalization properties. But the presence of phosphorous dopants creates other processing problems which are well known. Its elimination in the invention is a significant advantage.

The next step is to etch vias in the planarized binary glass formed by the bake step. This step is symbolized by FIG. 4(E). This etch step can be by any conventional etch process which will effectively etch a binary glass comprised of 45-50% germanium dioxide and the balance silicon dioxide. Such process are known, and are described in the references incorporated herein. The advantage of the planarization of the surface 40 in FIG. 3 is that photolithography can be precisely performed on it without suffering from depth of field problems which are normally encountered when projecting onto a non-flat surface. Such problems are well known and result from the image being focussed for a given distance from the mask. If all portions of the surface upon which the image is projected are not at the same distance from the lens, then portions of the image falling upon portions of the surface which are closer to or farther from the lens will be sliqhtly out of focus. This problem spoils the sharpness of the images which can be projected and limits the precision of the control of the geometry size that can be achieved and the precision of the control of spacing between features which can be reliably achieved. Forming a flat surface such as surface 40 in FIG. 3 upon which to deposit photoresist causes the photoresist to have a flat surface upon which a very sharp image of the desired vias can be focussed. The spacing of these via images can be as closer than in non-flat cases because the design rules can be made tighter in flat cases. The design rules can be tightened without fear of depth of field problems; these problems arise from Fuzzy definition of feature sizes which may cause overlap of features that are not supposed to overlap.

The next step, as symbolized in FIG. 4(F) is to deposit a layer of material from which to form the second layer of interconnects. In many embodiments where only two interconnect layers are to be formed, the second layer interconnect pattern will be formed out of a metal such as aluminum. In embodiments where more than two layers of interconnect are to be formed, the second layer of interconnect material is preferably polysilicon since its coefficient of thermal expansion is a better match with the binary glass which would be placed over it to insulate the second layer polysilicon from the third layer of interconnect material.

The basic process to form the second layer interconnect is to first deposit a layer of the interconnect material such as metal or doped polysilicon. Processes for depositing these layers are well known and are described in chapter 9 of Sze's *VLSI Technology* and in the Elliott book, both incorporated herein by reference. Any process to deposit this layer of conductive material which will give good conductor integrity and reliability will suffice for purposes of practicing the invention. That is, any method of metal deposition such as physical vapor deposition, resistance heated evaporation, electron beam evaporation, rf induction heated evaporation, sputter deposition magnetron sputter deposition, or chemical vapor deposition can be used if the method meets adequate quality standards for the deposited metal layer.

After the metal layer is deposited, a layer of photoresist is deposited over the metal layer and exposed to radiation through a mask containing the image of the desired metal interconnect pattern. Certain areas of the photoresist then cross-link and harden. The uncrosslinked resist is then washed away in a solvent leaving a hardened resist pattern on the surface of the metal to act as an etch shield. The desired metal interconnect pattern is then etched out of the metal layer using a suitable known etch process. This leaves the structure as shown in FIG. 3.

The spin-on process yields an insulator film with good film properties. One of these properties is uniformity of thickness of the film over the thickness of the wafer. That is referring to FIG. 3, the variation of the thickness of the layers 36 and 38 over the wafer surface is less than 5% from any point on the wafer surface to any other point on the wafer surface regardless of what speed the wafer was spun during the film formation. Of course, if some structure on the wafer surface has greatly projecting geometry, the spun-on glass may not cover its uppermost point, and the film thickness will be zero or very small on the point of such an unusual object. This may cause the 5% maximum deviation figure cited above to be inaccurate for this unusual case.

FIG. 5 illustrates the experimentally determined film thickness deviation in percent as a function of the spin speed at which the film was deposited. The film thickness is measured from the bottom of a valley such as the top surface of the deposited dielectric region 33 in FIG. 3.

Notice how the films 38 and 44 are thinner on top of the polysilicon conductors 26, 28 and 30 than in the valleys between and outside these conductors. This results from the forces of the spin process which tends to draw the gel off the top of projecting features of the topography and into the valleys. This is why spin-on processes result in flat surfaces for the deposited films.

The resulting film properties of the binary glass layer 36 and 38 are the same as any germanosilicate glass deposited in any other way except for the increased planarization of the top surface of the glass and the uniformity of the film thickness. These properties are a function of the method of deposit. i.e., the spin-on process. The other properties such a breakdown voltage, dielectric constant, refractive index stress, etch rate and density will be the same as for a germanosilicate glass of the same mole percent composition deposited in any other manner such as chemical vapor deposition (CVD) and heat treated in the same manner.

As to density the spun-on binary glass will have the same density as a similar binary glass deposited by CVD if the densification bake temperature after the spin-on is the same temperature as the densification temperature in the CVD process. Film flatness and uniformity of the spun-on glass will be far better than any glass deposited by CVD and heat treated in the same manner.

Although the invention has been described in terms of the preferred embodiment described herein it will be apparent to those skilled in the art that various modifications can be made without departing from the spirit and scope of the invention. All such modifications are intended to be included within the scope of the claims appended hereto.

What is claimed is:

1. A process for forming a binary germanosilicate glass on a wafer containing integrated circuits comprising the steps of:
    a. mixing a solution of tetraethoxysilane, tetraethoxygermane, a solvent and an acid;
    b. depositing the solution on said wafer;
    c. spinning the wafer until excess solution is spun off the wafer and the remaining solution is in equilibrium;
    d. baking the wafer and remaining solution until the solvent is driven off and a binary germanosilicate glass is formed.

2. The method of claim 2 wherein the solution is comprised of from 2.53 to 2.76 grams of tetraethoxygermane, from 2.47 to 2.24 grams of tetraethoxysilane, approximately 45 grams of a solvent which will dissolve the above two components and enough acid to cause formation of a gel in the solution.

3. The method of claim 3 wherein the solvent is a lower alcohol such as ethyl, propyl, methyl or butyl alcohol.

4. The method of claim 3 wherein the solvent is a ketone such as methylethylketone or acetone.

5. The method of claim 3 wherein the solvent is a combination of an alcohol and a ketone.

6. The method of claim 3 wherein the acid is $HNO_3$.

7. The method of claim 3 wherein the acid is HCl.

8. The method of claim 3 wherein the acid component of the solution is 0.03 grams of $HNO_3$.

9. The method of claim 2 wherein sufficient acid is added to adjust the pH of the solution to anywhere in the range from 1.5 to 2.0.

10. The method of claim 1 wherein the bake step is one bake step in the range from 450 to 500 degrees centigrade.

11. The method of claim 2 wherein the bake step is comprised of two bake steps, namely, a first bake at a sufficient temperature to drive off all the solvent in a reasonable time, and a second bake step to form in a reasonable amount of time the binary glass comprised of germanium dioxide and silicon dioxide 12. The method of claim 11 wherein said first bake step is performed at approximately 135 degrees centigrade for 5–10 minutes.

13. The method of claim 11 wherein said second bake step is performed at 450 to 500 degrees centigrade for 15 to 30 minutes.

14. The method of claim 11 wherein said second bake step is performed at 450 to 1000 degrees centigrade for 15 to 30 minutes.

15. The method of claim 1 wherein said bake step is a one-step bake at at least 400 degrees centigrade for a sufficient time to drive off all the solvent and to create the oxides of the binary glass.

16. The method of claim 1 wherein said bake step is comprised of a first bake step to drive off all the solvents and a second bake step at between 600 and 700 degrees centigrade to create and densify the binary germanosilicate glass.

17. The method of claim 1 wherein said spin step is done at an RPM which is selected to yield a selected film thickness in accordance with a relationship relating spin speed to film thickness for the solids content of the predetermined solution.

18. The method of claim 1 wherein said spin step is performed at between 2000 and 4000 RPM for a 10% tetraethoxysilane/tetraethoxygermane solution.

19. The method of claim 1 further comprising the steps of:
etching vias into said binary glass;
depositing a layer of conductive material; and
etching a conductive interconnect pattern in said pattern of conductive material.

20. A method as defined in claim 19 further comprising the steps of:
repeating the steps of claim 1 to form another layer of insulating binary germanosilicate glass over the second conductive layer formed in the steps of claim 19;
etching vias in this second layer of germanosilicate binary glass;
depositing another layer of conductive material; and
etching a third pattern of interconnects in said just-deposited conductive material.

21. A method of forming an insulating film of germanosilicate glass on the first interconnection layer of an integrated circuit comprising the steps of:
a. mixing a solution of between 2.53 and 2.76 grams tetraethoxygermane and between 2.47 and 2.24 grams tetraethoxysilane with approximately 45 grams of an alcohol or ketone and sufficient acid to raise the solution pH to between 1.5 and 2.0;
b. depositing a quantity of said solution onto a wafer of silicon sufficient to create a puddle which covers the whole surface of the wafer;
c. spinning the wafer for at least 30 seconds;
d baking the wafer and remaining solution at at least 400 degrees centigrade for a sufficient time to drive off all the solvents and to form a binary germanosilicate glass comPrised of 45 to 50 percent germanium dioxide and the balance silicon dioxide.

22. The method of claim 21 further comprising the steps of:
etching vias into said binary glass layer formed after the steps of claim 21 are performed;
depositing a second layer cf conductive material over the binary glass layer through which vias have just been etched so as to cover the vias and make connections to the underlying first interconnection layer; and
etching a second conductive interconnect pattern in said pattern of conductive material.

23. The method of claim 22 further comprising the steps of:
repeating the steps of claim 21 to form another layer of binary glass over the interconnect layer just formed;
etching vias in the binary glass layer just formed; and
depositing a layer of conductive material; and
etching an interconnect pattern out of the conductive layer just formed.

24. A semiconductor structure which is to be insulated comprising:
a first layer of conductive polysilicon material etched into interconnect patterns having edges, said patterns forming part of an integrated circuit;
a layer over said first layer of a solution comprising tetraethoxysilane, tetraethoxygermaine, a solvent, and an acid.

25. The structure of claim 24 wherein said layer over said first layer is adapted to form a germanosilicate glass comprised of from 45–5-% germanium dioxide and the balance of silicon dioxide.

26. A composition of matter comprising:
tetraethoxygermane;
tetraethoxysilane;
a solvent;
means for adjusting the pH of the solution sufficiently to form a polymeric solution suitable for coating techniques.

27. The composition of claim 29 wherein said solvent is selected from the group consisting of alcohols and ketones.

28. The composition of claim 29 wherein said means is an acid present is sufficient amount to adjust the pH to between 1.5 and 2.0.

29. The composition of claim 26 or 27 or 28 wherein said tetraethoxygermane is present in the quantity of from 2.53 to 2.76 grams.

30. The composition of claim 29 wherein said tetraethoxysilane is present in the quantity of from 2.47 to 2.24 grams.

31. A composition of matter comprising:
from 2.53 to 2.76 grams tetraethoxygermane;
from 2.47 to 2.24 grams tetraethoxysilane;
approximately 45 grams of a solvent selected from the group consisting of the lower alcohols and ketones; and
a sufficient quantity of acid selected from the group consisting of $HNO_3$ and HCL to bring the pH to between 1.5 and 2.0.

* * * * *

UNITED STATES PATENT AND TRADEMARK OFFICE
CERTIFICATE OF CORRECTION

PATENT NO. : 4,935,095

DATED : June 19, 1990

INVENTOR(S) : William I. Lehrer

It is certified that error appears in the above-identified patent and that said Letters Patent is hereby corrected as shown below:

```
Column 10, line 18, delete "claim 2" and insert --claim 1--.
Column 10, line 24, delete "claim 3" and insert --claim 1--.
Column 10, line 27, delete "claim 3" and insert --claim 1--.
Column 10, line 29, delete "claim 3" and insert --claim 1--.
Column 10, line 31, delete "claim 3" and insert --claim 2--.
Column 10, line 32, delete "claim 3" and insert --claim 2--.
Column 10, line 33, delete "claim 3" and insert --claim 2--.
Column 11, line 38, delete "comPrised" and insert --comprised--.
Column 12, line 29, delete "claim 29" and insert --claim 26--.
Column 12, line 32, delete "claim 29, and insert --claim 26--; and
          line 33, delete "present is' and insert --present in--.
```

Signed and Sealed this

Twenty-second Day of September, 1992

Attest:

DOUGLAS B. COMER

*Attesting Officer*   *Acting Commissioner of Patents and Trademarks*